United States Patent
Yamaguchi

(10) Patent No.: US 12,204,063 B2
(45) Date of Patent: Jan. 21, 2025

(54) DETECTION DEVICE

(71) Applicant: Japan Display Inc., Tokyo (JP)

(72) Inventor: Hiroshi Yamaguchi, Tokyo (JP)

(73) Assignee: Japan Display Inc., Tokyo (JP)

(*) Notice: Subject to any disclaimer, the term of this patent is extended or adjusted under 35 U.S.C. 154(b) by 130 days.

(21) Appl. No.: 18/078,622

(22) Filed: Dec. 9, 2022

(65) Prior Publication Data

US 2023/0194744 A1 Jun. 22, 2023

(30) Foreign Application Priority Data

Dec. 17, 2021 (JP) .................. 2021-205309

(51) Int. Cl.
*G01V 3/08* (2006.01)
*G06F 3/044* (2006.01)
*H03H 11/04* (2006.01)

(52) U.S. Cl.
CPC .............. *G01V 3/088* (2013.01); *G06F 3/044* (2013.01); *H03H 11/04* (2013.01); *G06F 2203/04108* (2013.01)

(58) Field of Classification Search
CPC ....... G01V 3/088; G06F 3/044; G06F 3/0418; G06F 3/0445; G06F 2203/04108; G06F 2203/04101; H03H 11/04; H03H 11/1286; H03H 11/1291
USPC ....................................................... 324/663
See application file for complete search history.

(56) References Cited

U.S. PATENT DOCUMENTS

| | | | | |
|---|---|---|---|---|
| 3,471,772 A * | 10/1969 | Smith | ............ | G01V 3/15 324/329 |
| 3,826,973 A * | 7/1974 | Pflaum | ............ | G01V 3/107 324/334 |
| 4,416,289 A * | 11/1983 | Bresler | ............ | A61B 5/062 128/207.14 |
| 5,043,666 A * | 8/1991 | Tavernetti | ............ | G01V 13/00 324/202 |
| 5,316,024 A * | 5/1994 | Hirschi | ............ | A61M 25/0127 607/116 |
| 7,296,683 B1 * | 11/2007 | Vallelonga, Sr. | ..... | B65F 1/1607 209/636 |
| 9,151,792 B1 * | 10/2015 | Kremin | ............ | G06F 1/169 |
| 2009/0120810 A1 * | 5/2009 | Phan | ............ | A61B 5/1486 205/792 |
| 2018/0249960 A1 * | 9/2018 | Gupta | ............ | H05K 1/0245 |

(Continued)

Primary Examiner — Christopher P McAndrew
(74) Attorney, Agent, or Firm — K&L Gates LLP

(57) ABSTRACT

A detection device includes: a detector including first electrodes and second electrodes disposed around a the first electrodes; a detection circuit configured to detect proximity of an external object to the detector; a power circuit configured to generate a square wave; and a filter that is coupled to the power circuit through an isolator and configured to receive the square wave transmitted through the isolator. The filter includes a low-pass filter circuit and a digital potentiometer. A periodically oscillating potential based on output from the filter is provided as a reference potential of the power circuit and provided to the second electrodes. A reference potential of the filter is a fixed potential. The power circuit can change the frequency of the generated square wave. The filter can change the frequency of the periodically oscillating potential in accordance with an electric resistance value of the digital potentiometer.

6 Claims, 14 Drawing Sheets

(56) References Cited

U.S. PATENT DOCUMENTS

| | | | |
|---|---|---|---|
| 2019/0143073 A1* | 5/2019 | Grossman | A61B 5/374 600/28 |
| 2020/0015876 A1* | 1/2020 | Chou | A61B 34/30 |
| 2020/0153410 A1* | 5/2020 | Nielsen | H03H 11/12 |
| 2021/0373683 A1* | 12/2021 | Kremin | G06F 3/044 |

* cited by examiner

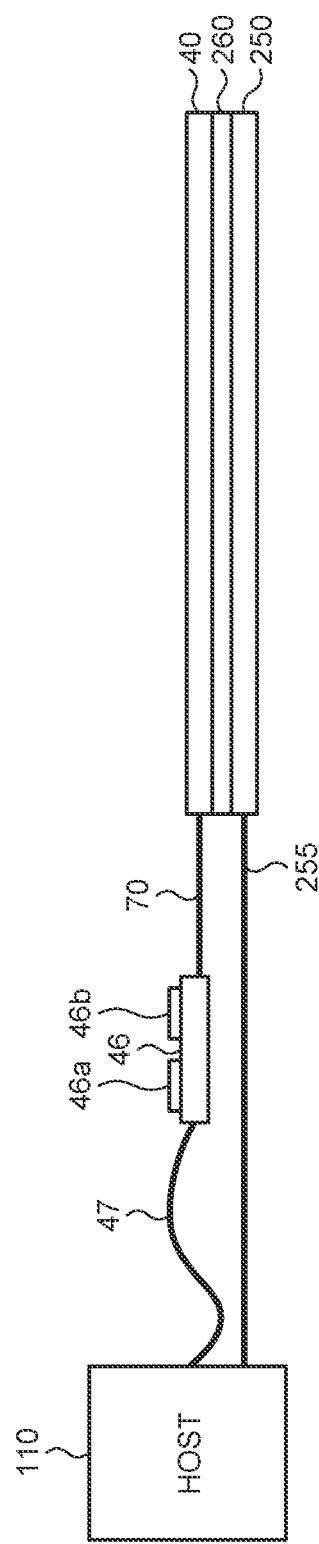

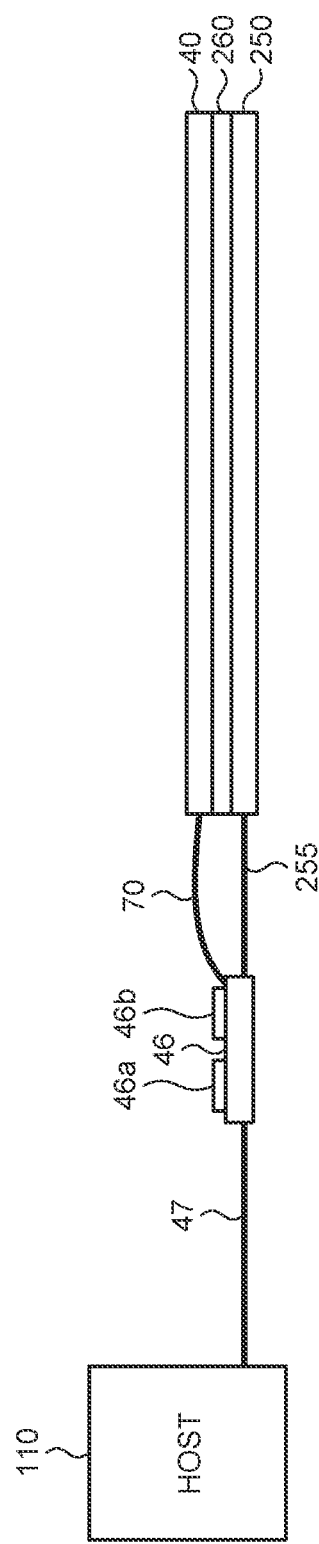

DETECTION DEVICE

CROSS-REFERENCE TO RELATED APPLICATION

This application claims the benefit of priority from Japanese Patent Application No. 2021-205309 filed on Dec. 17, 2021, the entire contents of which are incorporated herein by reference.

BACKGROUND

1. Technical Field

What is disclosed herein relates to a detection device.

2. Description of the Related Art

A detection device that detects proximity of an object has been known (for example, U.S. Pat. No. 9,151,792). This detection device includes a plurality of detection electrodes and a shield electrode disposed around a detection region in which the detection electrodes are provided, and an electric signal is provided to the shield electrode.

When a periodically oscillating potential that functions as alternating current is provided to the shield electrode, the frequency of the periodically oscillating potential interferes with the frequency of external periodically oscillating potential, in some cases.

For the foregoing reasons, there is a need for a detection device that can more excellently reduce occurrence of interference.

SUMMARY

According to an aspect, a detection device includes: a detector including a plurality of first electrodes arranged in a predetermined direction and a plurality of second electrodes disposed around a detection region in which the first electrodes are disposed; a detection circuit configured to detect proximity of an external object to the detector based on electric change at the first electrodes; a power circuit configured to generate a square wave based on electric power supply from outside; and a filter that is coupled to the power circuit through an isolator and configured to receive the square wave transmitted through the isolator. The filter includes a low-pass filter circuit and a digital potentiometer. A periodically oscillating potential based on output from the filter is provided as a reference potential of the power circuit and provided to the second electrodes. A reference potential of the filter is a fixed potential. The power circuit is provided capable of changing the frequency of the generated square wave. The filter is provided capable of changing the frequency of the periodically oscillating potential in accordance with an electric resistance value of the digital potentiometer.

According to another aspect, a detection device includes: a detector including a plurality of first electrodes and a plurality of second electrodes disposed around a detection region in which the first electrodes are disposed; a detection circuit configured to detect proximity of an external object to the detector based on electric change at the first electrodes; a power circuit configured to generate a periodically oscillating potential based on electric power supply from outside; a filter that is coupled to the power circuit through an isolator and configured to receive the periodically oscillating potential transmitted through the isolator; and an amplifier configured to amplify a signal output from the filter and supply the amplified signal as a reference potential of the second electrodes and the detector. The frequency of the periodically oscillating potential and a frequency component cut by the filter are changeable.

BRIEF DESCRIPTION OF THE DRAWINGS

FIG. 15 is a schematic diagram illustrating an exemplary configuration in which a detector 40 and a display panel 250 are stacked; and FIG. 16 is a schematic diagram illustrating another exemplary configuration in which the detector 40 and the display panel 250 are stacked.

DETAILED DESCRIPTION

Embodiments of the present disclosure will be described below with reference to the accompanying drawings. What is disclosed herein is merely exemplary, and any modification that could be easily thought of by the skilled person in the art as appropriate without departing from the gist of the disclosure is contained in the scope of the present disclosure. For clearer description, the drawings are schematically illustrated for the width, thickness, shape, and the like of each component as compared to an actual aspect in some cases, but the drawings are merely exemplary and do not limit interpretation of the present disclosure. In the present specification and drawings, any element same as that already described with reference to an already described drawing is denoted by the same reference sign, and detailed description thereof is omitted as appropriate in some cases.

In this disclosure, when an element is described as being "on" another element, the element can be directly on the other element, or there can be one or more elements between the element and the other element.

Figure 1:
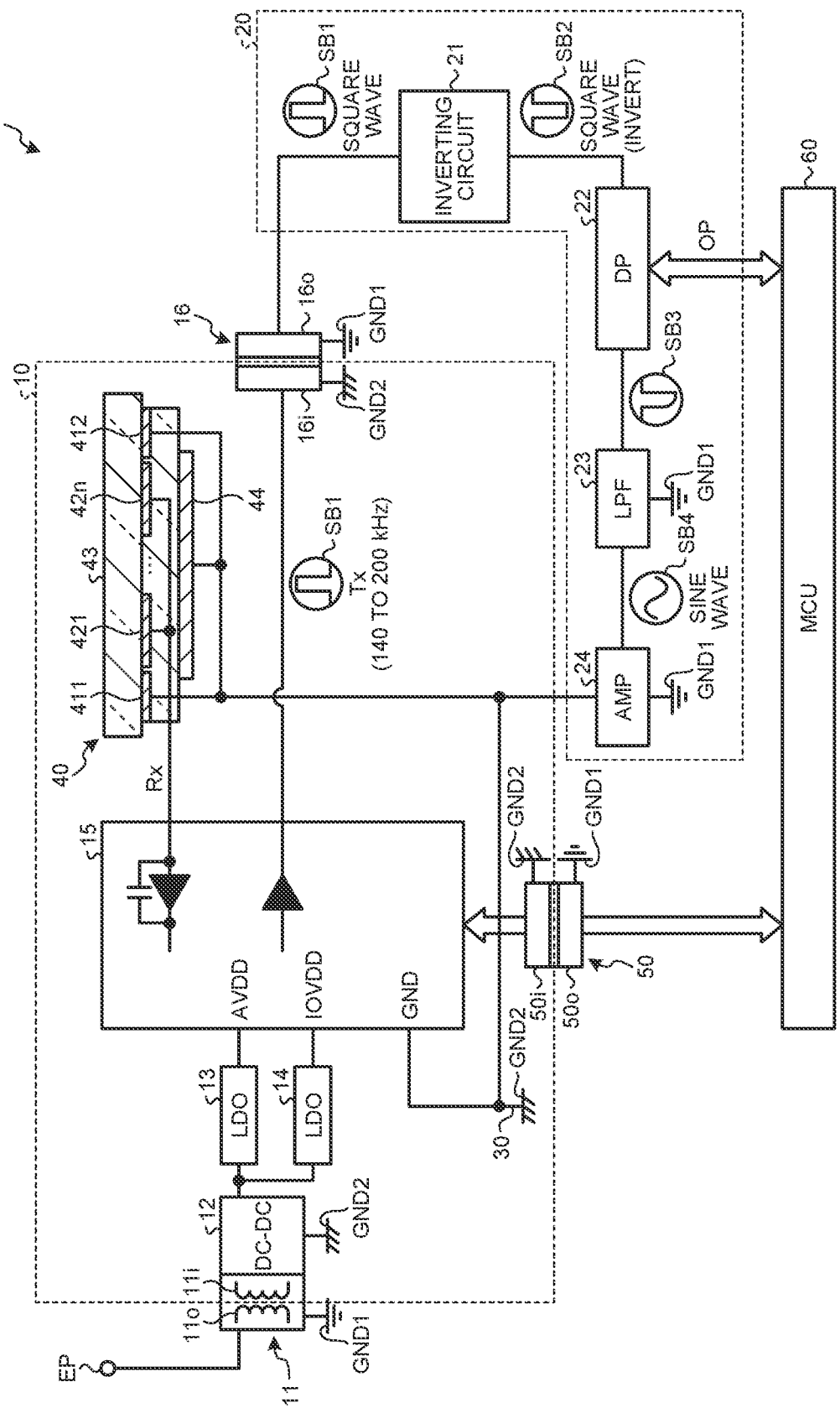
FIG. 1 is a diagram illustrating a main configuration of a detection device.

FIG. 1 is a diagram illustrating a main configuration of a detection device 1. The detection device 1 includes a body part 10, an active filter block 20, and a micro controller unit (MCU) 60. The detection device 1 is a detection device configured to detect proximity of an object. Hereinafter, hover detection means detection of proximity of an object that is performed by the detection device 1.

The body part 10 includes a first isolator 11, a DC-DC converter 12, low dropouts (LDO) 13 and 14, an analog front-end (AFE) 15, a second isolator 16, a detector (sensor) 40, and a third isolator 50.

The first isolator 11 insulates a power source EP and the body part 10 from each other and supplies electric power to the body part 10 using electric power supply from the power source EP. Specifically, the first isolator 11 includes, for example, coils 11o and 11i. The coil 11o generates a magnetic field when electric power is supplied from the power source EP to the coil 11o. The coil 11i is provided in the area of the influence of the magnetic field generated by the coil 11o. The coil 11i generates induced electromotive force in accordance with the magnetic field generation by the coil 11o. The electric power generated by the coil 11o is supplied to the DC-DC converter 12.

The DC-DC converter 12 converts direct-current voltage supplied from the coil 11i. The LDOs 13 and 14 are linear regulators interposed between the DC-DC converter 12 and the AFE 15 and configured to adjust voltage to be output to the AFE 15 to more appropriate voltage. The AFE 15 is an integrated circuit including a plurality of analog circuits related to various functions of the body part 10. The output voltage from the LDO 13 corresponds to voltage required as an analog power source (AVDD) of the AFE 15. The output voltage from the LDO 14 corresponds to voltage requested as an input-output power source (IOVDD) of the AFE 15.

The AFE 15 is a circuit configured to operate depending on electric power supply from the power source EP. The AFE 15 outputs a periodically oscillating potential having a periodic pattern. The AFE 15 in the embodiment outputs a square wave Tx as the periodically oscillating potential. The square wave Tx is transmitted through the second isolator 16 and output to the active filter block 20. The second isolator 16 insulates the active filter block 20 and the body part 10 from each other, generates substantially the same square wave as the square wave Tx output from the AFE 15 and input to the second isolator 16, and outputs the generated square wave to an inverting circuit 21 of the active filter block 20. Specifically, the second isolator 16 includes, for example, an input portion 16i and an output portion 16o. Signal transmission between the input portion 16i and the output portion 16o is performed by, for example, an optical insulation scheme using a photo coupler, but may be performed by a magnetic insulation scheme based on the same principle as that for the first isolator 11 or by a capacitance insulation scheme using the principle of a capacitor. As the square wave Tx is output from the AFE 15 to the input portion 16i, the output portion 16o generates substantially the same square wave.

Hereinafter, the square wave Tx means a square wave as an example of the periodically oscillating potential that is output from the AFE 15. In FIG. 1, the waveform of the square wave Tx output from the AFE 15 to the inverting circuit 21 through the second isolator 16 is schematically illustrated as a waveform SB1.

The DC-DC converter 12, the LDOs 13 and 14, the AFE 15, and the detector 40 in the body part 10 are electrically insulated from other components coupled therewith through the first isolator 11, the second isolator 16, and the third isolator 50. The components insulated from the body part 10, such as the coil 11o, the output portion 16o, and a second end part 500 to be described later, are provided with a reference potential from a first reference potential GND1. The first reference potential GND1 is, for example, a ground potential or a fixed potential held by a large-sized electrode such as a solid electrode. Components, such as the DC-DC converter 12, the input portion 16i, and a first end part 50i to be described later, that are insulated from the components coupled to the first reference potential GND1 are provided with a reference potential from a second reference potential GND2. The second reference potential GND2 is a periodically oscillating potential generated by the active filter block 20. The second reference potential GND2 periodically oscillates relative to GND1.

Details of the detector 40 and the third isolator 50 among the components of the body part 10 will be described later. The following describes the active filter block 20.

The active filter block 20 includes the inverting circuit 21, a digital potentiometer (DP) 22, a low-pass filter (LPF) 23, and an amplifier (AMP) 24.

The inverting circuit 21 inverts the square wave output from the AFE 15 and provided to the active filter block 20 through the second isolator 16. The inverting circuit 21 may be, for example, a CMOS logic circuit that functions as an inverter with a NOT circuit, or a field programmable gate array (FPGA) provided to function in the same manner. In FIG. 1, the waveform of the square wave inverted by the inverting circuit 21 is schematically illustrated as a waveform SB2. The inverting circuit 21 may be omitted when it is not necessary to invert the polarity of the periodically oscillating potential provided to the active filter block 20.

The DP 22 generates an intermediate wave based on the square wave inverted by the inverting circuit 21. The DP 22 is a digital potentiometer circuit (DP circuit) configured to generate, on the output transmission path of the square wave inverted by the inverting circuit 21, electric resistance in accordance with a command from the MCU 60. The square wave inverted by the inverting circuit 21 becomes the intermediate wave by the electric resistance. In FIG. 1, the waveform of the intermediate wave generated by the DP 22 is schematically illustrated as a waveform SB3.

Figure 2:
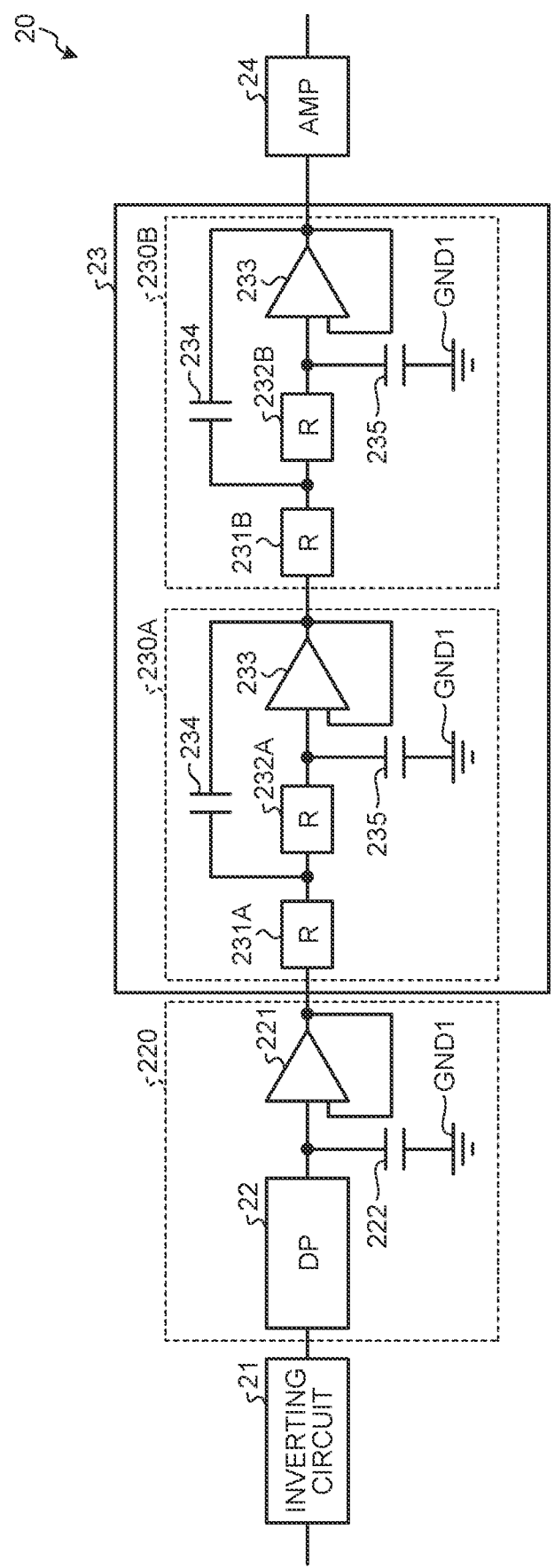
FIG. 2 is a diagram illustrating an exemplary configuration of an active filter block.

FIG. 2 is a diagram illustrating an exemplary configuration of the active filter block 20. The LPF 23 generates a sine wave based on the intermediate wave generated by the DP 22. Specifically, the LPF 23 is a Sallen-Key fourth-order active LPF as illustrated in, for example, FIG. 2. As illustrated in FIG. 2, the LPF 23 includes a first part circuit 230A and a second part circuit 230B. The first part circuit 230A and the second part circuit 230B are arranged in the stated order from the DP 22 side toward the AMP 24 side on the transmission path between the DP 22 and the AMP 24 and coupled in series.

The first part circuit 230A includes resistors 231A and 232A, an AMP 233, and capacitive elements 234 and 235. The resistor 231A, the resistor 232A, and the AMP 233 are arranged in the stated order from the DP 22 side toward the AMP 24 side on the transmission path between the DP 22 and the AMP 24 and are coupled in series. An output-side terminal of the resistor 232A is coupled to the positive input of the AMP 233 as an amplifier. A wiring line branched from the output of the AMP 233 is coupled to the negative input of the AMP 233. The AMP 233 is, for example, an operation amplifier.

The capacitive elements 234 and 235 are electrical storages (capacitors) in which electric charge is accumulated. One end of the capacitive element 234 is coupled to the signal transmission path between the resistor 231A and the resistor 232A. The other end of the capacitive element 234 is coupled to the output path of the AMP 233. One end of the capacitive element 235 is coupled to the signal transmission path between the resistor 232A and the AMP 233. The other end of the capacitive element 235 is coupled to the first reference potential GND1.

The second part circuit 230B has the configuration of the first part circuit 230A in which the resistors 231A and 232A are replaced with resistors 231B and 232B. In a similar manner to the resistors 231A and 232A, the resistors 231B and 232B are electronic components provided to obtain a predetermined electric resistance value.

The resistors 231A, 232A, 231B, and 232B are denoted by individual reference signs because these do not necessarily have the same electric resistance value and are provided to have different electric resistance values in order to achieve a desired function of the LPF 23 in some cases. That is, if the resistors are denoted by the same reference sign, they might be misunderstood that they have the same electric resistance value. To avoid this, the resistors are denoted by individual reference signs.

In the configuration of the active filter block 20 illustrated in FIG. 2, an AMP 221 is provided between the DP 22 and the LPF 23. An output-side terminal of the DP 22 is coupled to the positive input of the AMP 221 as an amplifier. A wiring line branched from the output of the AMP 221 is coupled to the negative input of the AMP 221. One end of a capacitive element 222 is coupled to a wiring line that couples the DP 22 and the AMP 221. The capacitive element 222 is an electrical storage (capacitor) in which electric charge is accumulated. The other end of the capacitive element 222 is coupled to the first reference potential GND1. Circuitry 220 including the DP 22, the AMP 221, and the capacitive element 222 having the other end coupled to the first reference potential GND1 functions as a LPF.

In generating a sine wave from a square wave, the circuitry 220 and the first and second part circuits 230A and 230B included in the LPF 23 cut a high-frequency wave component that is unnecessary for conversion of the square wave into the sine wave. Thus, a sine wave can be generated from the square wave Tx transmitted through the second isolator 16 and output to the active filter block 20.

Figure 3:
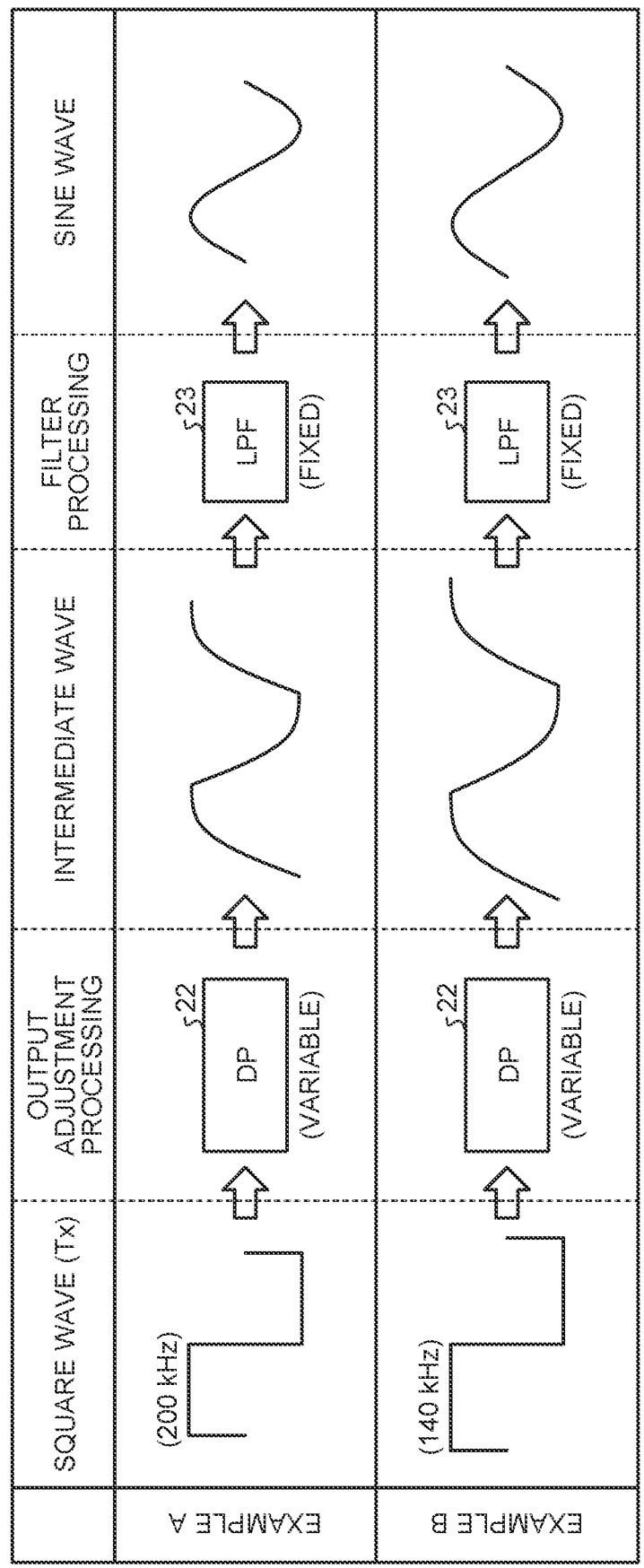
FIG. 3 is a schematic diagram illustrating signal waveform change through a DP and an LPF.

FIG. 3 is a schematic diagram illustrating signal waveform change through the DP 22 and the LPF 23. A square wave output from the AFE 15 to the active filter block 20 through the second isolator 16 becomes an intermediate wave by output adjustment processing in accordance with the electric resistance value of the DP 22. The intermediate wave becomes a sine wave by filter processing at the LPF 23. The frequency of the square wave Tx in the embodiment is not fixed. In a specific example, the AFE 15 can change the wavelength of a sine wave to be output in the range of 140 kHz to 200 kHz. In Example A illustrated in FIG. 3, the wavelength of the sine wave is 200 kHz. In Example B illustrated in FIG. 3, the wavelength of the sine wave is 140 KHz.

Figure 4:
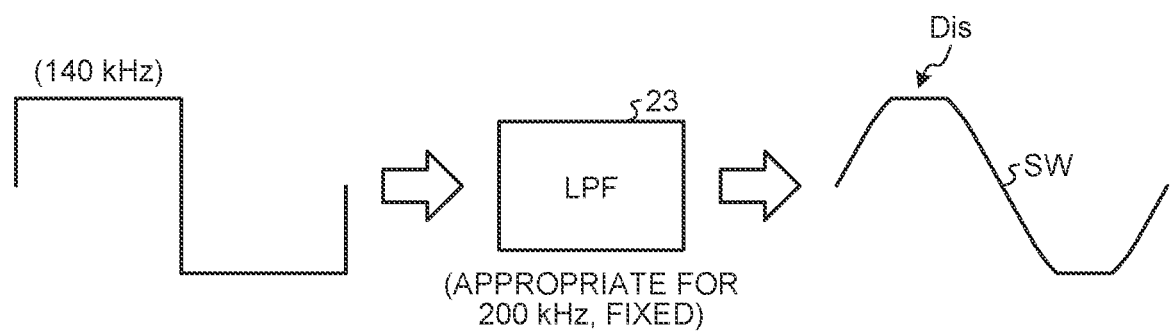
FIG. 4 is a schematic diagram illustrating an action of the LPF in a reference example.

FIG. 4 is a schematic diagram illustrating an action of a LPF in a reference example. A "function to generate a sine wave from a square wave", which a LPF such as the DP 22 has, is typically optimized to one predetermined frequency. Thus, for example, when a square wave with a frequency (for example, 140 kHz) different from 200 kHz is input to a LPF optimized for 200 kHz, an undesirable signal wave SW having a change pattern Dis with distorted time-series change of signal strength corresponding to the peak of the amplitude of a sine wave might be generated as illustrated in FIG. 4.

However, according to the embodiment, the DP 22 is controlled to an electric resistance value corresponding to the frequency of the square wave Tx, a more appropriate sine wave with reduced undesirable change pattern such as the above-described distorted change pattern Dis can be generated from the square wave Tx with a plurality of frequencies as illustrated in FIG. 3. In other words, in the active filter block 20 according to the embodiment described above with reference to FIGS. 1 and 2, the function of the LPF 23 is static but the electric resistance value of the DP 22 can be dynamically changed, and thus a sine wave can be generated based on the square wave Tx with a frequency included in a predetermined frequency band (for example, 140 kHz to 200 kHz). In FIG. 1, the waveform of the sine wave generated by the LPF 23 is schematically illustrated as a waveform SB4.

Figure 5:
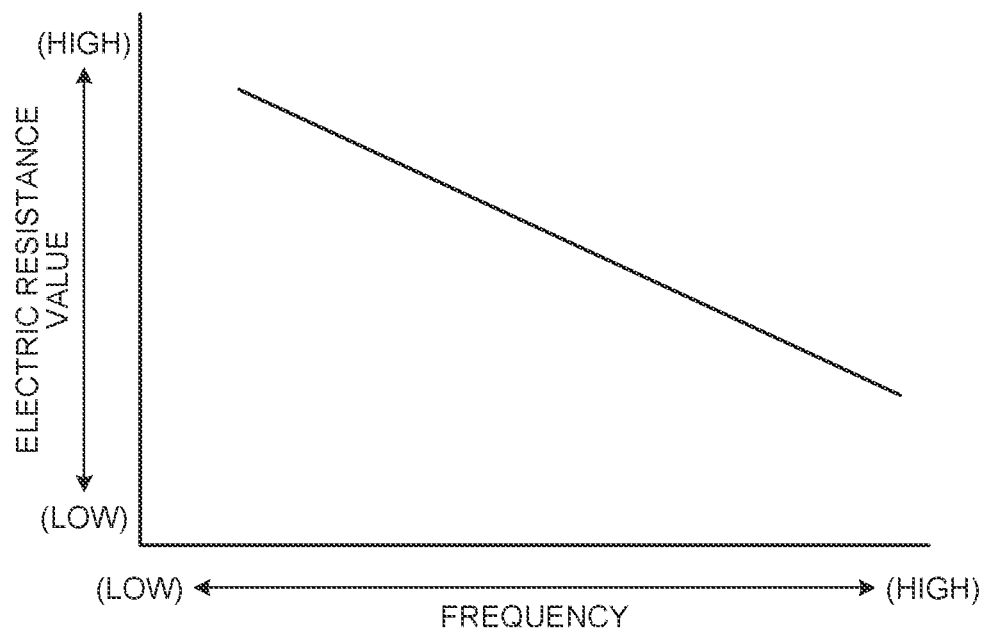
FIG. 5 is a graph schematically illustrating the relation between the frequency of a sine wave and the electric resistance value of the DP in accordance with the frequency.

FIG. 5 is a graph schematically illustrating the relation between the frequency of a sine wave and the electric resistance value of the DP 22 in accordance with the frequency. In the embodiment, the electric resistance value of the DP 22 is controlled to increase as the frequency of the sine wave decreases, and the electric resistance value of the DP 22 is controlled to decrease as the frequency of the sine wave increases. With such control of the electric resistance value of the DP 22, the LPF 23 can reliably output the sine wave. The sine wave in description with reference to FIG. 5 is a sine wave output from the AFE 15, transmitted to the active filter block 20 through the second isolator 16, and inverted by the inverting circuit 21.

Figure 6:
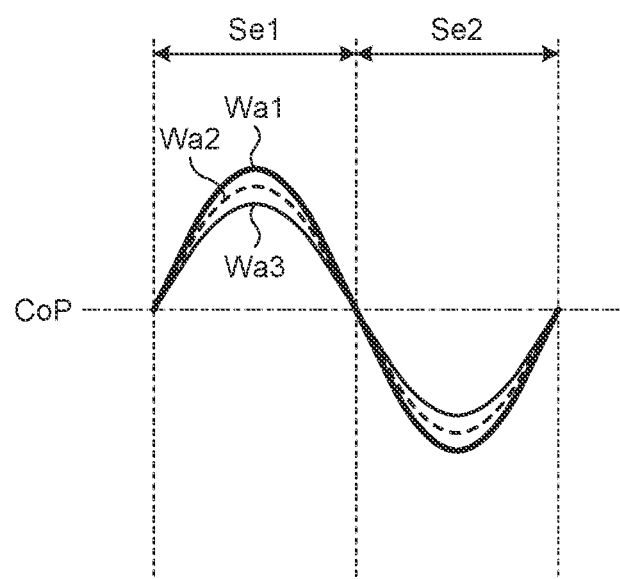
FIG. 6 is a diagram illustrating exemplary waveforms of a plurality of sine waves Wa1, Wa2, and Wa3 having different amplitudes.

FIG. 6 is a diagram illustrating exemplary waveforms of a plurality of sine waves Wa1, Wa2, and Wa3 having different amplitudes. The three sine waves Wa1, Wa2, and Wa3 exemplified in FIG. 6 have larger amplitudes with respect to a center potential CoP of the amplitude in the stated order. Control of the electric resistance value of the DP 22 can be used for control of the amplitude of a sine wave generated at the LPF 23. Specifically, the higher the electric resistance value of the DP 22, the lower the amplitude of the sine wave. Thus, for example, when the DP 22 is controlled so that the electric resistance value of the DP 22 is relatively low in the range of the electric resistance value in which no distorted waveform such as the distorted change pattern Dis described above with reference to FIG. 4 is generated, the LPF 23 can generate a sine wave having a relatively large amplitude like the sine wave Wa1. Moreover, when the DP 22 is controlled to increase the electric resistance value of the DP 22 as compared to the electric resistance value when the sine wave Wa1 is generated, the LPF 23 can generate sine waves such as the sine waves Wa2 and Wa3 having amplitudes smaller than that of the sine wave Wa1 in accordance with the magnitude of the electric resistance value of the DP 22.

The AMP 24 is a buffer circuit configured to amplify a sine wave output from the LPF 23. The sine wave amplified by the AMP 24 is provided as a reference potential (GND) of the AFE 15. The sine wave amplified by the AMP 24 is provided as a reference potential (the second reference potential GND2) of various components provided in the body part 10 through a transmission part 30. For example, a reference potential of the DC-DC converter 12 and the input portion 16*i* described above is the second reference potential GND2. The sine wave amplified by the AMP 24 is also provided to second electrodes 411 and 412 of the detector 40.

Figure 7:
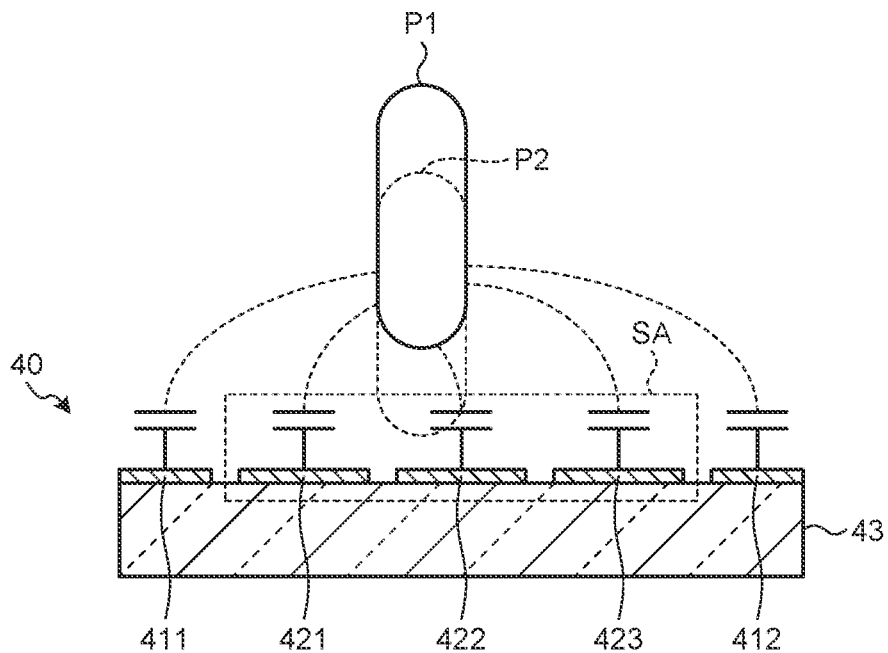
FIG. 7 is a schematic diagram illustrating electricity flow in an electric field generated when the potential of each second electrode is higher than the potential of each first electrode.
Figure 8:
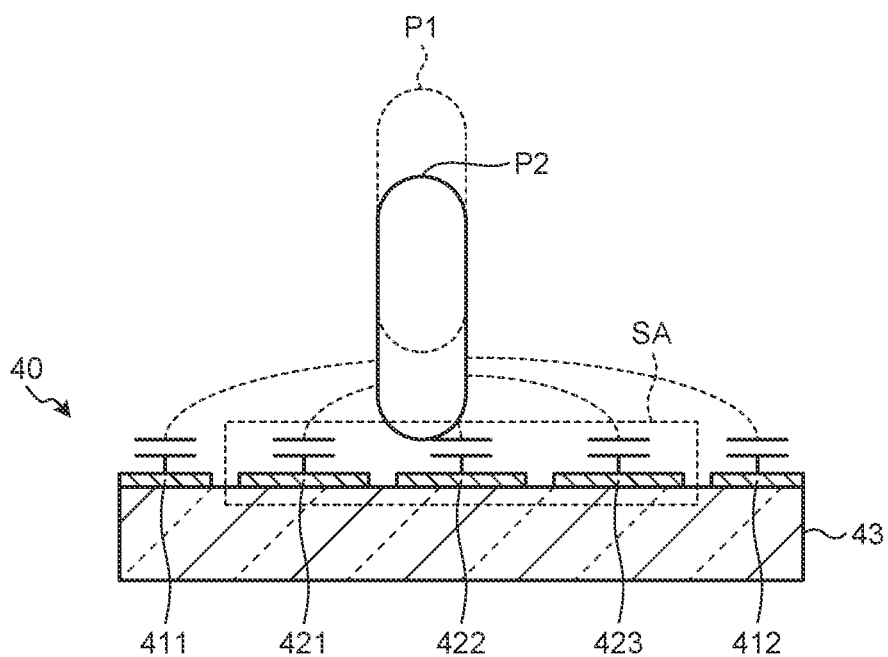
FIG. 8 is a schematic diagram illustrating electricity flow in an electric field generated when the potential of each second electrode is lower than the potential of each first electrode.

The detector 40 includes first electrodes 421, . . . 42*n*, the second electrodes 411 and 412, an insulator 43, and a shield electrode 44. The second electrode 411, the first electrodes 421, . . . , 42*n*, and the second electrode 412 are aligned on the insulator 43. The index n of the first electrodes 421, . . . 42*n* is a natural number. For example, in a case of n=3, the first electrodes 421, . . . , 42*n* mean the first electrodes 421, 422, and 423 as illustrated in FIGS. 7 and 8 to be described later. The insulator 43 is a film or plate member formed of an insulating material and is, for example, a resin film or a glass substrate. The shield electrode 44 is a film or plate electrode facing the first electrodes 421, . . . , 42*n* with the insulator 43 interposed therebetween. The second electrodes 411 and 412 and the shield electrode 44 function as active shields having a potential that periodically varies depending on potential change caused by the sine wave provided from the AMP 24. As illustrated in FIG. 1, the AFE 15 is coupled to the first electrodes 421, . . . , 42*n*. With the self-capacitance of the first electrodes 421, . . . , 42*n*, an electric signal is output from each of the first electrodes 421, . . . , 42*n* to the AFE 15. Thus, the AFE 15 can acquire, as a detection signal Rx indicating the state of the detector 40, electric output that occurs depending on the self-capacitance of each of the first electrodes 421, . . . , 42*n*. A region in which the first electrodes 421, . . . , 42*n* are provided functions as a detection region SA. The first electrodes 421, . . . , 42*n* in the detection region SA function as detection electrodes in hover detection. The second electrodes 411 and 412 disposed around the detection region SA function as shield electrodes in hover detection.

FIG. 7 is a schematic diagram illustrating a case in which an object in proximity to the detector 40 is located at a position P1. FIG. 8 is a schematic diagram illustrating a case in which the object in proximity to the detector 40 is located at a position P2. The detection signal strength obtained from each of the first electrodes 421, 422, and 423 is different between the case in which the object in proximity to the detector 40 is located at the position P1 and the case in which the proximity object is located at the position P2.

Figure 9:
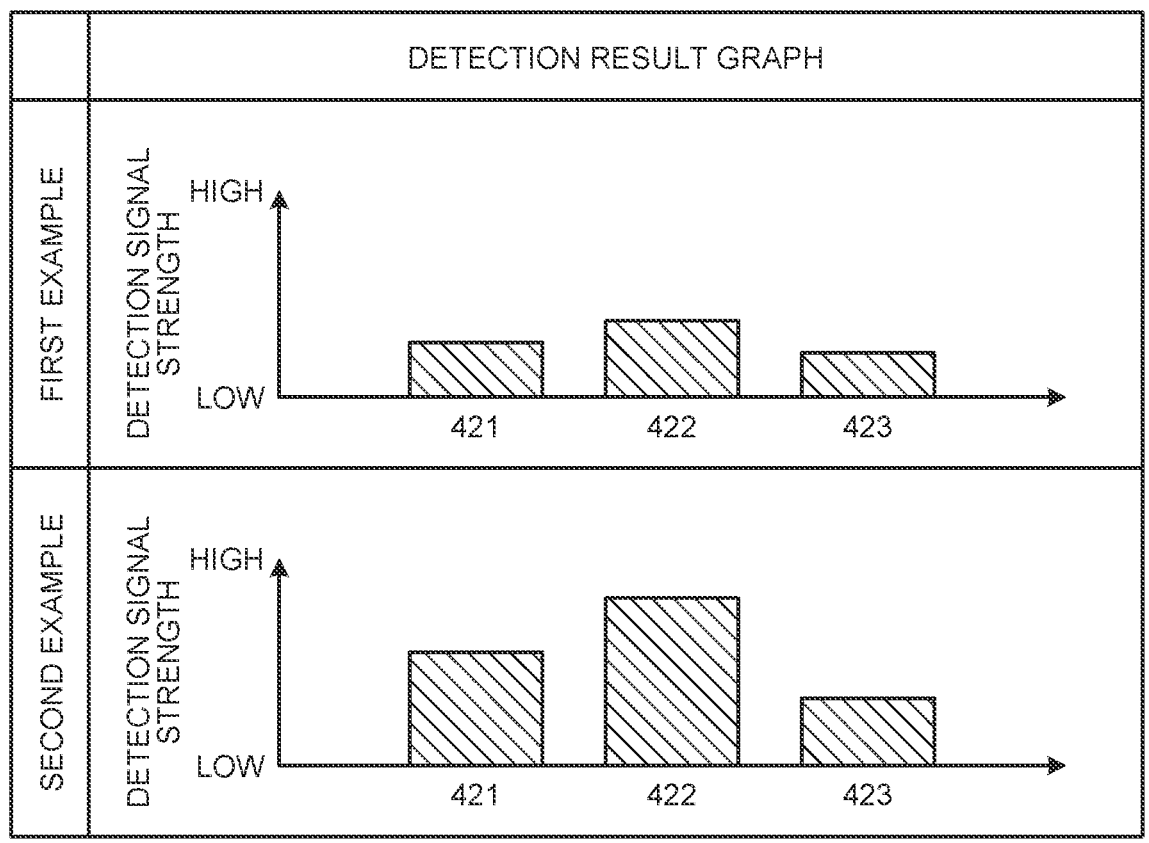
FIG. 9 is a schematic graph illustrating exemplary detection signal strength obtained from each first electrode.

FIG. 9 is a schematic graph illustrating exemplary detection signal strength obtained from each of the first electrodes 421, 422, and 423. The numbers illustrated below bar graphs are the reference signs of the first electrodes 421, 422, and 423. The first example in FIG. 9 is a graph illustrating the detection signal strength obtained from each of the first electrodes 421, 422, and 423 when the proximity object is located at the position P1. A second example in FIG. 9 is a graph illustrating the detection signal strength obtained from each of the first electrodes 421, 422, and 423 when the proximity object is located at the position P2. The AFE 15 detects the degree of proximity of the object in proximity to the insulator 43 based on the relation between the detection signal strength obtained from each of the first electrodes 421, . . . , 42*n* (for example, the first electrodes 421, 422, and 423) and the amplitudes provided to the second electrodes 411 and 412 at a timing when a detection signal indicating the detection signal strength is obtained. In this manner, the degree of proximity of the object in proximity to the insulator 43 can be detected in hover detection. In hover detection, it is possible to detect entry of the proximity object into an electric field generated between each of the second electrodes 411 and 412 and each of the first electrodes 421, . . . , 42*n*.

Since the sine wave is provided to the ground (GND) of the AFE 15 as described above, the AFE 15 can obtain, based on the input to the ground (GND), information indicating the potential of each of the second electrodes 411 and 412 at the acquisition timing of the detection signal from each of the first electrodes 421, . . . , 42*n*.

The AFE 15 outputs data indicating a result of hover detection to the MCU 60 through the third isolator 50. The third isolator 50 insulates the MCU 60 and the body part 10 from each other, generates, based on an electric signal that is output from the AFE 15 and input to the MCU 60, substantially the same electric signal, and outputs the generated electric signal to the MCU 60. Specifically, the third isolator 50 includes the first end part 50*i* and the second end part 50*o* as illustrated in, for example, FIG. 1. The scheme of signal transmission between the first end part 50*i* and the second end part 50*o* may be the same as or different from that of signal transmission between the input portion 16*i* and the output portion 16*o* in the second isolator 16 described above. However, when the detection device 1 has a function of frequency hopping to be described later, the third isolator 50 is configured to be able to transmit an input from the first end part 50*i* side to the second end part 50*o* side and transmit an input from the second end part 50*o* side to the first end part 50*i* side. Hereinafter, sensing data means data that indicates a result of hover detection and that is output from the AFE 15 and input to the MCU 60 through the second isolator 16.

The MCU 60 performs outputting related to the sensing data to an external information processing device, which is not illustrated in the drawings. The information processing device is, for example, a SoC (system on a chip) of a smartphone provided with the detection device 1 according to the embodiment but not limited thereto and is changeable as appropriate.

The MCU 60 determines the electric resistance value of the DP 22 in accordance with setting performed in advance. Specifically, the MCU 60 includes a storage (storage circuit) configured to store information indicating the frequency of the square wave Tx output from the AFE 15. The storage is, for example, a register but may be any other storage circuit having the same function. The MCU 60 outputs a command OP for controlling the DP 22 to provide an electric resistance value in accordance with the frequency indicated by the information stored in the storage. The DP 22 has the electric resistance value in accordance with the command OP.

In the embodiment, the frequency of the square wave Tx output from the AFE 15 is, for example, a particular frequency determined in the range of 140 kHz to 200 kHz as described above, but the particular frequency is merely exemplary. The power source frequency of the power source EP is not limited thereto and is changeable as appropriate.

The MCU 60 performs noise determination processing of the sensing data and proximity object position determination (coordinate calculation processing) based on the sensing data. The noise determination processing means processing performed to determine the amount of noise included in the sensing data. The coordinate calculation processing means calculation processing performed to determine the position of an object in proximity to the insulator 43. In the coordinate calculation processing, the position of the object in proximity to the detector 40 can be derived in, for example, an X direction, a Y direction, and a Z direction illustrated in FIG. 11 to be described later. Details of the noise determination processing and the coordinate calculation processing are the same as those of corresponding well-known processing, and thus detailed description thereof is omitted.

Figure 10:
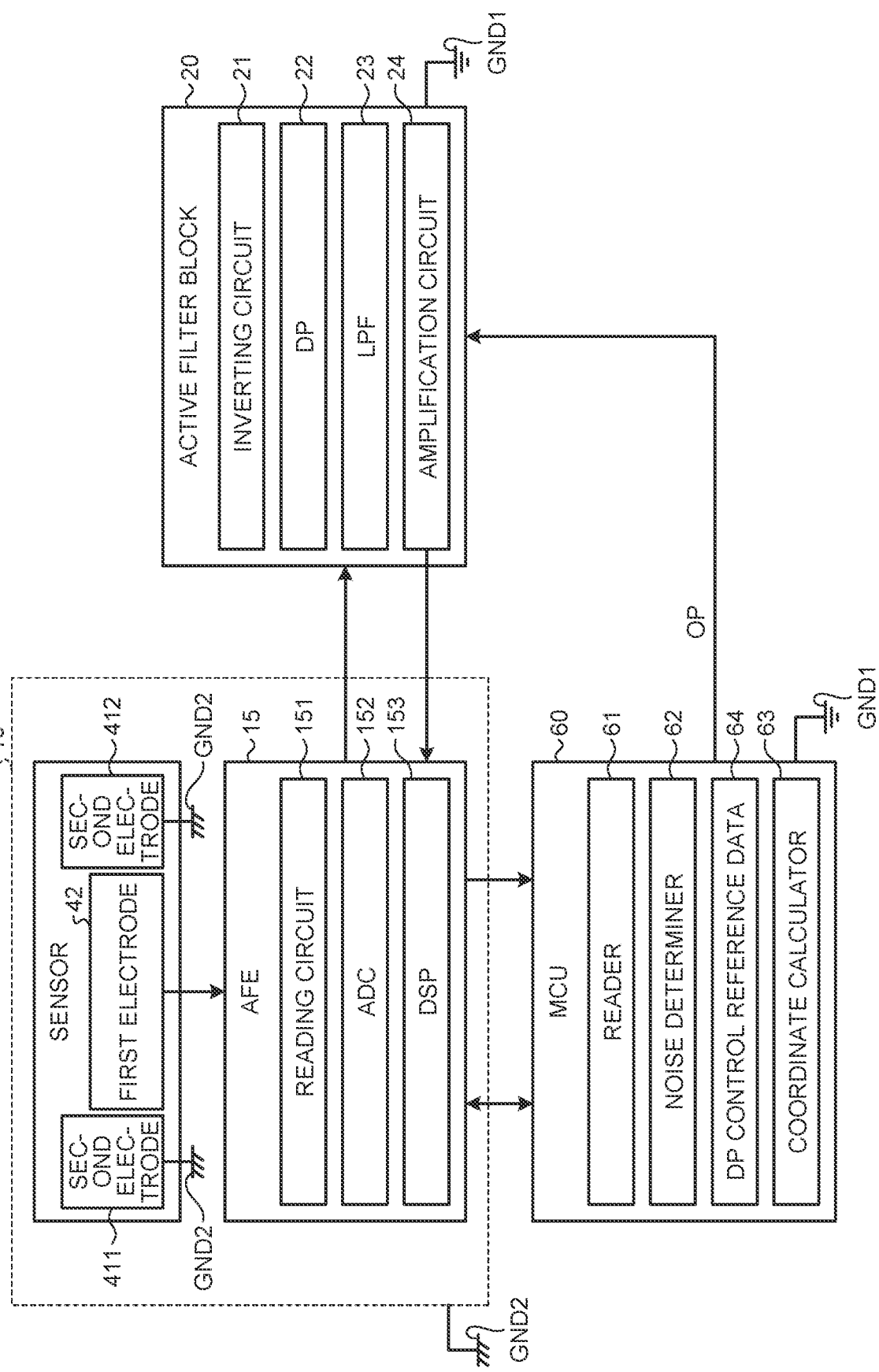
FIG. 10 is a block diagram illustrating an exemplary functional configuration of the detection device.

FIG. 10 is a block diagram illustrating an exemplary functional configuration of the detection device 1. The AFE 15 includes a reading circuit 151, an analog-digital converter (ADC) 152, and a digital signal processor (DSP) 153. A first electrode 42 illustrated in FIG. 10 denotes the first electrodes 421, ..., 42n. The reading circuit 151 acquires the detection signal Rx from each of the first electrodes 421, ..., 42n. The ADC 152 converts the detection signal Rx acquired by the reading circuit 151 from analog to digital form. The DSP 153 performs hover detection based on the detection signal Rx converted into digital form by the ADC 152. The AFE 15 outputs data indicating a result of the hover detection performed by the DSP 153 to the MCU 60 through the third isolator 50.

The MCU 60 includes a reader 61, a noise determiner 62, and a coordinate calculator 63. The reader 61 acquires the sensing data. The noise determiner 62 performs the above-described noise determination processing based on the sensing data acquired by the reader 61. The coordinate calculator 63 performs the above-described coordinate calculation processing based on the sensing data acquired by the reader 61. As illustrated in FIG. 10, a reference potential of the MCU 60 is the first reference potential GND1.

The MCU 60 stores therein DP control reference data 64. The DP control reference data 64 is data associating the frequency of the square wave output from the AFE 15 and transmitted to the active filter block 20 through the second isolator 16 with the electric resistance value of the DP 22 depending on the frequency. More specifically, the DP control reference data 64 is, for example, tabulated data associating the frequency and the electric resistance on a one-to-one basis. The MCU 60 refers to the DP control reference data 64 and outputs the command OP that sets the electric resistance value of the DP 22 to an electric resistance value in accordance with the frequency of the square wave that is output from the AFE 15 and transmitted to the active filter block 20 through the second isolator 16.

The MCU 60 has a function to change the frequency of the square wave Tx output from the AFE 15. When the frequency of the square wave Tx output from the AFE 15 is changed, the MCU 60 sets the electric resistance value of the DP 22 again in accordance with the changed frequency of the square wave Tx.

Figure 11:
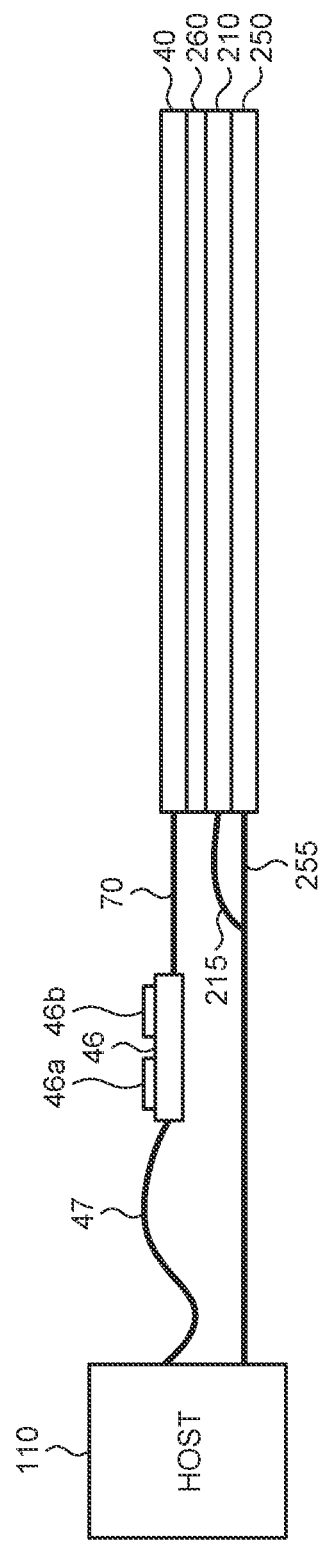
FIG. 11 is a schematic diagram illustrating an exemplary multilayered structure of a hover touch panel display to which the detection device is attached.

FIG. 11 is a schematic diagram illustrating an exemplary multilayered structure of a hover touch panel display 200 to which the detection device 1 is attached. The detector 40 of the detection device 1 is placed over a touch panel 210 of the hover touch panel display 200. The touch panel 210 performs touch detection. Touch detection is detection of a contact operation with a detection surface 201 of the hover touch panel display 200 by an external object based on capacitance change. A specific scheme of the touch detection may be what is called a self-capacitance scheme or a mutual-capacitance scheme that uses capacitance generated between two electrodes.

The touch panel 210 illustrated in FIG. 11 is sandwiched between a display panel 250 and the detector 40 in the Z direction. The display panel 250 is a display panel configured to display an image. When the display panel 250 is a liquid crystal display device, a backlight is provided on a side of the display panel 250 opposite to the touch panel 210 side thereof.

The arrangement direction of the second electrode 411, the first electrodes 421, ..., 42n, and the second electrode 412 described above is orthogonal to the Z direction. In FIG. 11, the X and Y directions are orthogonal to the Z direction. The X and Y directions are orthogonal to each other. The arrangement direction of the second electrode 411, the first electrodes 421, ..., 42n, and the second electrode 412 is, for example, at least one of the X and Y directions. The first electrodes 421, ..., 42n are disposed in a matrix of rows and columns when the second electrode 411, the first electrodes 421, ..., 42n, and the second electrode 412 are arranged in the X and Y directions. In this case, two pairs of the second electrodes 411 and 412 are provided such that the second electrodes 411 and 412 in one of the pairs face each other in the X direction and sandwich the first electrodes 421, ... 42n and such that the second electrodes 411 and 412 in the other pair face each other in the Y direction and sandwich the first electrodes 421, ..., 42n.

In the configuration illustrated in FIG. 11, the detection device 1 includes a flexible printed circuit (FPC) 70. The FPC 70 is coupled to a printed circuit board (PCB) 46. Various circuits included in the active filter block 20 described above are mounted on the PCB 46. In, for example, FIG. 11, circuits 46a and 46b are illustrated as examples of the various circuits. The circuits 46a and 46b are, for example, circuits that function as the AFE 15 and the MCU 60. The touch panel 210 includes a FPC 215. Various circuits related to operation of the touch panel 210 are provided on the FPC 215. The display panel 250 includes a FPC 255. Various circuits related to operation of the display panel 250 are provided on the FPC 255. Functions of the various circuits related to operation of the touch panel 210 and the various circuits related to operation of the display panel 250 are the same as corresponding known functions, and thus detailed description thereof is omitted. The touch panel 210 and the detector 40 are bonded to each other by, for example, an optical clear adhesive (OCA) 260, but the OCA 260 is not essential and a space (air gap) may be provided at the position of the OCA 260 instead. The FPC 255 is coupled to the FPC 215. The FPC 255 is coupled to a host 110. The host 110 is, for example, circuitry configured to function as a host computer for a device including the detector 40, the touch panel 210, and the display panel 250. The device is, for example, a point-of-sale (POS) cash register terminal but is not limited thereto and may be any other terminal capable of receiving touch operation and hover operation. The PCB 46 is coupled to the host 110 through a FPC 47.

Hover detection with the second electrode 411, the first electrodes 421, ..., 42n, and the second electrode 412 is performed by using a capacitance electric field as described above. Touch detection with the touch panel 210 is performed based on capacitance as well.

Assume that a case in which the frequency of an electric signal provided to the electrodes included in the touch panel 210 to generate capacitance at the touch panel 210 is equal to the frequency of a sine wave provided to the second electrodes 411 and 412 in the detector 40. In this case, the touch panel 210 potentially malfunctions due to influence of the sine wave provided to the second electrodes 411 and 412 in the detector 40.

Thus, in the embodiment, the frequency of the sine wave provided to the second electrodes 411 and 412 in the detector 40, that is, the frequency of the square wave Tx from which the sine wave is generated, is changeable. Thus, malfunction of the touch panel 210 can be reduced irrespective of the frequency of an electric signal employed for the touch panel 210. Such change of the frequency of the square wave Tx is referred to as frequency hopping in some cases.

Figure 12:
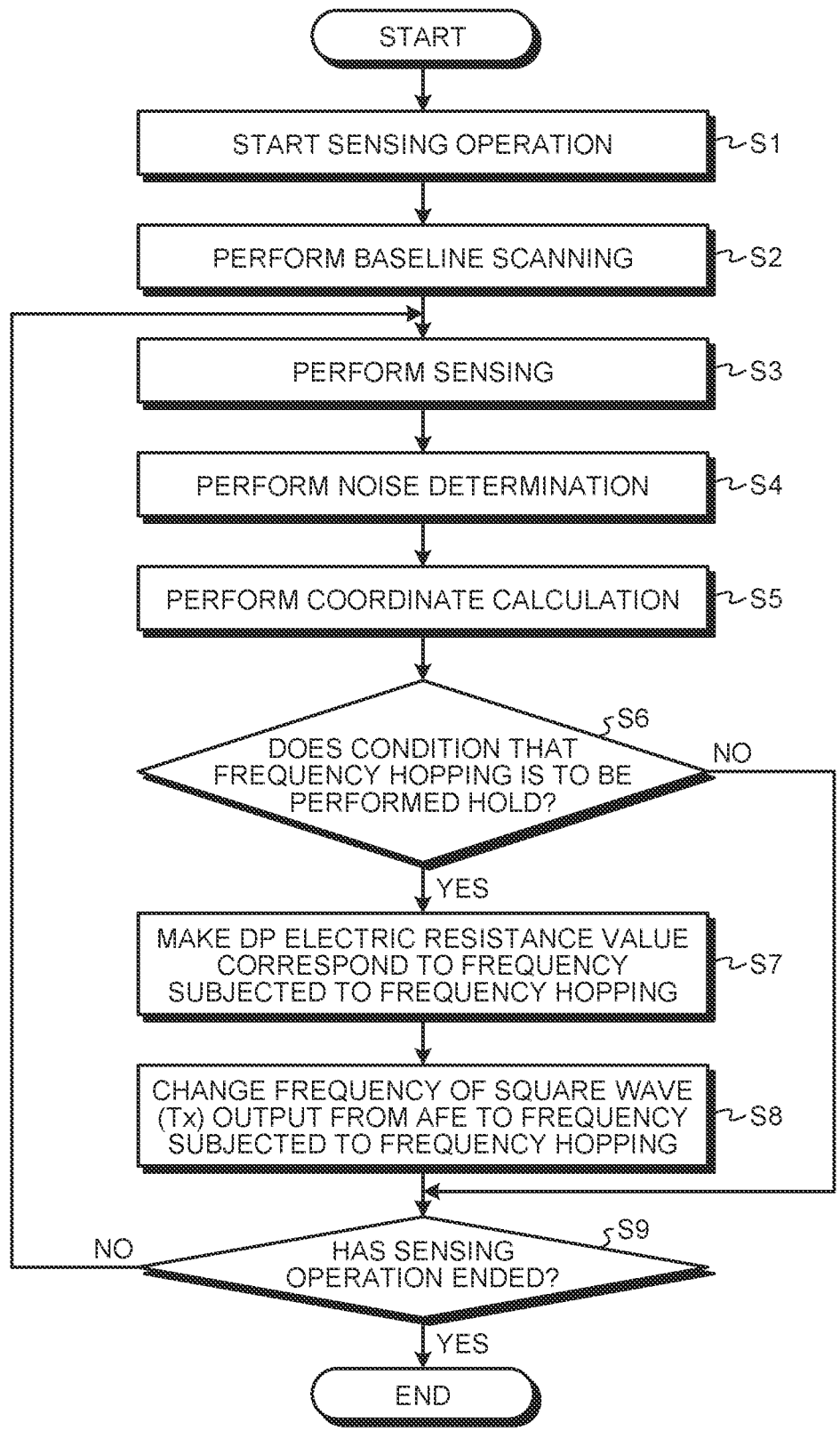
FIG. 12 is a flowchart illustrating an exemplary process of processing related to operation of the detection device.

FIG. 12 is a flowchart illustrating an exemplary process of processing related to operation of the detection device 1. First, sensing operation by the detection device 1 starts (step S1). Specifically, components of the detection device 1 such as the AFE 15 are provided with electric power from the power source EP and activated. Subsequently, baseline scanning is performed (step S2). Specifically, acquisition of a detection signal is performed based on an assumption of a state in which no object is in proximity to the insulator 43, and measurement based on the detection signal is performed for a "detection signal in a state in which no object is in proximity thereto". Thus, in the processing at step S2, the square wave Tx is output from the AFE 15, a sine wave is generated by the active filter block 20, and the detection signal Rx is acquired from each of the first electrodes 421, . . . , 42n by the MCU 60.

After the processing at step S2, sensing is performed (step S3). In the processing at step S3, the square wave Tx is output from the AFE 15, a sine wave is generated by the active filter block 20, and the detection signal Rx is acquired from each of the first electrodes 421, . . . , 42n by the MCU 60. The noise determiner 62 performs the above-described noise determination processing based on the detection signal Rx acquired in the processing at step S3 (step S4). The coordinate calculator 63 performs the coordinate calculation processing based on the detection signal Rx acquired in the processing at step S3 (step S5). Although steps S4 and S5 are illustrated in the stated order in FIG. 12, the processing at step S4 and the processing at step S5 may be performed in any order and may be performed in parallel or in the reverse order. In the processing at step S4 and the processing at step S5, the MCU 60 performs the noise determination processing and the coordinate calculation processing based on the difference between the detection signal Rx obtained in the processing at step S2 (baseline scanning) and the detection signal Rx obtained in the processing at step S3 (sensing).

Subsequently, the MCU 60 checks whether a condition for performing the frequency hopping is satisfied (step S6). Specifically, the MCU 60 checks whether a signal including a command that instructs execution of the frequency hopping is input from the external information processing device coupled through the FPC 255 described above with reference to, for example, FIG. 11. The hover touch panel display 200 may have a function to automatically satisfy the condition for performing the frequency hopping. For example, functions of the detection device 1 or a circuit provided to the FPC 255 include at least a first function, a second function, and a third function. The first function is a function to acquire information indicating the frequency (first frequency) of an electric signal supplied to the electrodes included in the touch panel 210. The second function is a function to acquire information indicating the frequency (second frequency) of a sine wave supplied to the second electrodes 411 and 412 in the detector 40. The third function is a function to output, to the MCU 60, information indicating that the condition for performing the frequency hopping is satisfied when the first frequency is equal to the second frequency. When the detection device 1 has the first function, the second function, and the third function, a dedicated circuit having some or all of these functions may be provided or the MCU 60 may have some or all of these functions.

When the condition for performing the frequency hopping is satisfied in the processing at step S6 (Yes at step S6), the MCU 60 causes the electric resistance value of the DP 22 to correspond to a frequency subjected to the frequency hopping (step S7). In the processing at step S7, the MCU 60 refers to, for example, the above-described DP control reference data 64 and determines an electric resistance value corresponding to the frequency subjected to the frequency hopping. Then, the MCU 60 sets the electric resistance value of the DP 22. Thus, the electric resistance value of the DP 22 becomes an electric resistance value corresponding to the square wave Tx subjected to the frequency hopping. In other words, the DP 22 and the LPF 23 become able to cooperatively generate a sine wave from the square wave. The MCU 60 changes the frequency of the square wave Tx output from the AFE 15 to the frequency subjected to the frequency hopping (step S8). Specifically, the MCU 60 outputs, to the AFE 15, a signal that functions as a command for changing the frequency to the frequency subjected to the frequency hopping. The signal is transmitted through the third isolator 50 and output to the AFE 15. The AFE 15 changes the frequency of the square wave Tx to the frequency subjected to the frequency hopping in accordance with the signal. Although steps S7 and S8 are illustrated in the stated order in FIG. 12, the processing at step S7 and the processing at step S8 may be performed in any order and may be performed in parallel or in the reverse order. However, the processing at step S7 and the processing at step S8 are performed so that, when the frequency of the square wave Tx becomes a frequency changed through the frequency hopping, the electric resistance value of the DP 22 is or becomes the resistance value corresponding to the changed frequency (the change of the resistance value has been or is completed).

When the sensing operation of the detection device 1 has ended (Yes at step S9), the detection device 1 ends operation. Examples of the case in which the sensing operation has ended include a case in which electric power supply from the power source EP has stopped and a case in which a command to end the sensing operation has been output to the hover touch panel display 200 from the external information processing device coupled through the FPC 255. When the sensing operation of the detection device 1 has not ended (No at step S9), the detection device 1 transitions to the processing at step S3 again. When the condition for performing the frequency hopping is not satisfied in the processing at step S6 (No at step S6), the detection device 1 transitions to the processing at step S9. In other words, the processing at step S7 and the processing at step S8 are not performed in this case.

Besides the relation between the frequency of an electric signal provided to the electrodes included in the touch panel 210 to generate capacitance at the touch panel 210 and the frequency of a sine wave provided to the second electrodes 411 and 412 in the detector 40, noise occurs to the detection signal Rx of the detector 40 due to external periodic electrical change in some cases. In this case, it is possible, by performing the frequency hopping, to reduce noise that occurs due to the relation between the periodic electrical change and the frequency of the sine wave provided to the second electrodes 411 and 412 in the detector 40.

Figure 13:
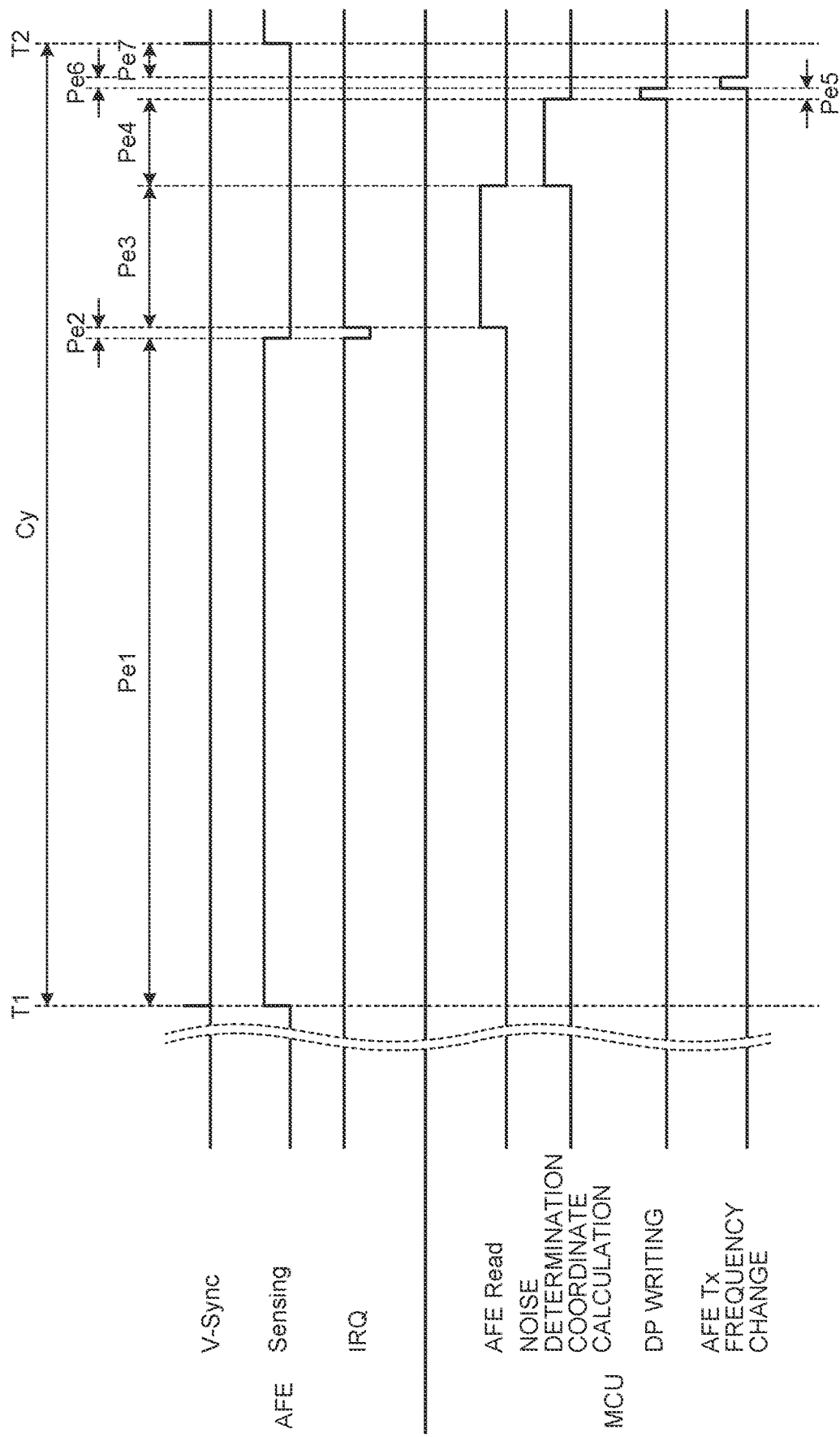
FIG. 13 is a timing chart illustrating an exemplary process of operation of a detection device capable of performing frequency hopping.

FIG. 13 is a timing chart illustrating an exemplary process of operation of the detection device 1 that can perform the frequency hopping. The processing by the operation of the detection device 1 is defined for each repetition period Cy. First, a clock signal (V-Sync) indicating start of the repetition period Cy is output in a predetermined cycle. In FIG. 13, the clock signal is output at timings T1 and T2. The following describes the details of processing in the repetition period Cy starting at the timing T1.

The sensing operation (Sensing) corresponding to the above-described processing at step S3 starts at the timing T1. The sensing operation is performed in a period Pe1 from the timing T1 to the start of a period Pe2 in which an interrupt signal (IRQ) indicating the end of the sensing operation is generated.

Periods Pe3, Pe4, Pe5, Pe6, and Pe7 sequentially occur from the end of the period Pe2 to the timing T2. The period Pe3 is a period in which reading (AFE Read) of the detection signal Rx by the AFE 15 is performed. The period Pe4 is a period in which the noise determination processing corresponding to the above-described processing at step S4 and the coordinate calculation processing corresponding to the above-described processing at step S5 are performed in parallel. The period Pe5 is a period in which command output (information writing) for reflecting, to the DP 22, an electric resistance value corresponding to the frequency of the square wave Tx subjected to the frequency hopping is performed when the frequency hopping is performed. The period Pe6 is a period in which outputting to the AFE 15 for changing the frequency of the square wave Tx to the frequency subjected to the frequency hopping is performed when the frequency hopping is performed. The period Pe7 is a blank period from the end of the period Pe6 to the timing T2.

From the timing T2 as a starting point, the above-described periods Pe1, . . . , Pe7 are repeated. Subsequently, the above-described periods Pe1, . . . , Pe7 are repeated for each of output of the clock signal (V-Sync) indicating the start of the repetition period Cy that is output in the predetermined cycle.

The frequency of the square wave Tx before and after change by the frequency hopping is, for example, a frequency in the range of 140 kHz to 200 kHz but is not limited thereto, and the range is changeable as appropriate. In a more specific example, the square wave Tx has an initial frequency of 200 kHz in the processing at step S1. The initial frequency is changeable in the range of 140 kHz to 200 kHz by the frequency hopping.

As described above, according to the embodiment, the detection device 1 includes a detector (the detector 40) including a plurality of first electrodes (the first electrodes 421, . . . , 42n) arranged in a predetermined direction (for example, at least one of the X and Y directions) and a plurality of second electrodes (the second electrodes 411 and 412) disposed around a detection region (the detection region SA) in which the first electrodes are disposed, a detection circuit (the MCU 60) configured to detect proximity of an external object to the detector based on electrical change at the first electrodes, a power circuit (the AFE 15) configured to generate a square wave (the square wave Tx) based on electric power supply from outside, and a filter (the active filter block 20) that is coupled to the power circuit through an isolator (the second isolator 16) and configured to receive the square wave transmitted through the isolator. The filter includes a low-pass filter circuit (the LPF 23) and a digital potentiometer (the DP 22). A periodically oscillating potential (the second reference potential GND2) based on output from the filter is provided as a reference potential of the power circuit and provided to the second electrodes. A reference potential of the filter is a fixed potential. The power circuit can change the frequency of the generated square wave (square wave Tx). The filter can change the frequency of the periodically oscillating potential in accordance with an electric resistance value of the digital potentiometer.

Thus, the power circuit (AFE 15) can change the frequency of the generated square wave (square wave Tx) and the filter (active filter block 20) can change the frequency of the periodically oscillating potential in accordance with the electric resistance value of the digital potentiometer (DP 22). Therefore, even when an electric event that would interfere with the potential of the first electrodes (first electrodes 421, . . . , 42n) externally occurs, it is possible to more excellently reduce occurrence of such interference by changing the frequency of the square wave and the frequency of the periodically oscillating potential.

The filter (active filter block 20) includes an amplification circuit (AMP 24) configured to amplify the periodically oscillating potential generated by the low-pass filter circuit (LPF 23) and provide the amplified periodically oscillating potential to the power circuit (AFE 15) and the second electrodes (second electrodes 411 and 412). Thus, the periodically oscillating potential based on output from the filter can be further amplified.

The periodically oscillating potential (second reference potential GND2) based on output from the filter (active filter block 20) is a sine wave generated by the filter based on the square wave generated by the power circuit (AFE 15) and transmitted through the isolator (second isolator 16). Thus, it is possible to more highly accurately detect proximity of an external object based on the sine wave.

The low-pass filter circuit (LPF 23) cuts a frequency band in accordance with the electric resistance value of the digital potentiometer (DP 22). Thus, a frequency component to be cut by the filter (active filter block 20) can be set as appropriate in accordance with setting of the electric resistance value of the digital potentiometer. In other words, the periodically oscillating potential (second reference potential GND2) based on output from the filter can be changed to a sine wave at higher accuracy.

The detection device 1 further includes a setting circuit (the MCU 60) configured to set the frequency of the square wave (square wave Tx) and the frequency of the periodically oscillating potential (second reference potential GND2) based on output from the filter (active filter block 20). With the setting circuit, it is possible to more easily perform setting for more excellently reducing occurrence of interference. A reference potential of the setting circuit is a fixed potential (the first reference potential GND1).

Modification

Figure 14:
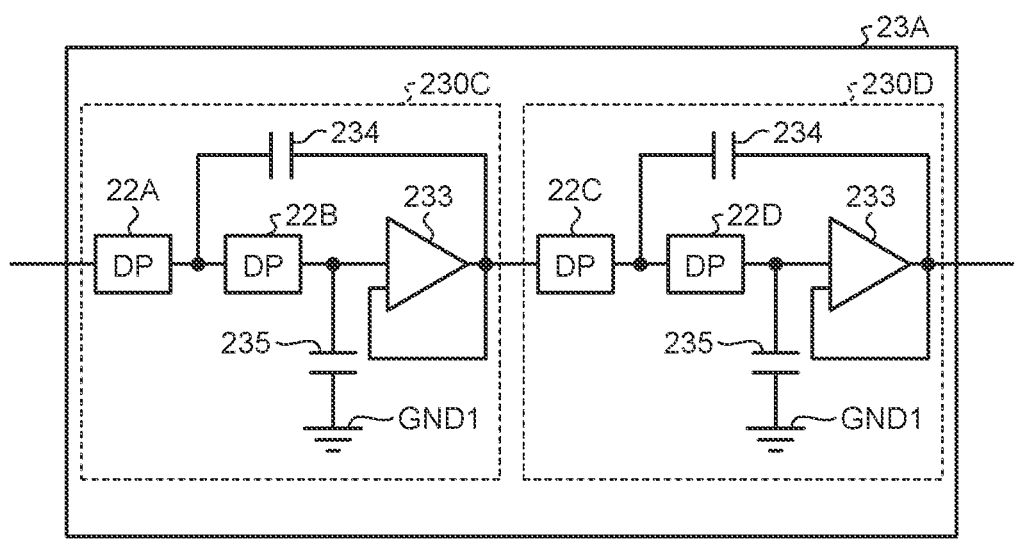
FIG. 14 is a diagram illustrating the configuration of a LPF according to a modification.

The following describes a modification of the embodiment with reference to FIG. 14. In description of the modification, any component identical to that in the embodiment is denoted by the same reference sign and description thereof is omitted in some cases.

FIG. 14 is a diagram illustrating the configuration of a LPF 23A according to the modification. In the modification, the DP 22, the LPF 23, and the components provided between the DP 22 and the LPF 23 in the configuration of the active filter block 20 described above with reference to FIG. 2 are replaced with the LPF 23A illustrated in FIG. 14.

The LPF 23A includes a first part circuit 230C and a second part circuit 230D. The first part circuit 230C and the second part circuit 230D are arranged in the stated order from the inverting circuit 21 side toward the AMP 24 side on the transmission path between the inverting circuit 21 and the AMP 24 and coupled in series.

The first part circuit 230C has a configuration in which the resistors 231A and 232A included in the first part circuit 230A are replaced with DPs 22A and 22B. The second part circuit 230D has a configuration in which the resistors 231B and 232B included in the first part circuit 230A are replaced with DPs 22C and 22D. In a similar manner to the DP 22, the electric resistance value of each of the DPs 22A, 22B, 22C, and 22D can be individually changed under control of the MCU 60.

The DPs 22A, 22B, 22C, and 22D are denoted by individual reference signs because these do not necessarily have the same electric resistance value and are provided to have different electric resistance values in order to achieve a desired function of the LPF 23A in some cases. That is, if the DPs are denoted by the same reference sign, they might be misunderstood that they have the same electric resistance value. To avoid this, the DPs are denoted by individual reference signs.

According to the modification, digital potentiometers (for example, the DPs 22A, 22B, 22C, and 22D) are provided as electric resistors included in a Sallen-Key filter circuit (for example, the LPF 23A) provided as a LPF. With this configuration, a frequency component that is cut by the Sallen-Key filter circuit can be optimized in accordance with the frequency of the square wave Tx. Thus, it is easy to increase the accuracy of sine wave generation by performing frequency component cut by the Sallen-Key filter circuit.

Moreover, with the configuration illustrated in FIG. 14, the electric resistance values of the DPs 22A, 22B, 22C, and 22D can be individually set, and thus it is easy to further increase the accuracy of sine wave generation by performing frequency component cut by the LPF 23A.

Two or more of the detector 40, the touch panel 210, and the display panel 250 in the hover touch panel display 200 exemplified in FIG. 11 may be integrated. For example, the detector 40 and the touch panel 210 are provided as cells outside the display panel 250 in the hover touch panel display 200 exemplified in FIG. 11, but the detector 40 may be placed over what is called an in-cell touch detection display panel in which the display panel 250 and the detector 40 are integrated. Alternatively, the detector 40 and the touch panel 210 may be integrated with each other and placed over the display panel 250.

FIG. 15 is a schematic diagram illustrating an exemplary configuration in which the detector 40 and the display panel 250 are stacked. As illustrated in FIG. 15, the touch panel 210 and the FPC 215 described above with reference to FIG. 11 may be removed from the configuration including the detector 40.

FIG. 16 is a schematic diagram illustrating another exemplary configuration in which the detector 40 and the display panel 250 are stacked. As illustrated in FIG. 16, the FPC 255 may be coupled to the PCB 46. In this case, the FPC 47 further includes wiring for transmitting signals generated between the display panel 250 and the host 110.

Although the MCU 60 functions as the detection circuit and the setting circuit in the above-described embodiment, a circuit that functions as the detection circuit and a circuit that functions as the setting circuit may be individually provided. A circuit in which the function of the AFE 15, the various functions of the active filter block 20, and the function of the MCU 60 are integrated may be mounted on the FPC 70. In this case, the PCB 46 and the FPC 47, for example, in FIG. 11 may be omitted, and the FPC 70 and the FPC 255 may be merged and coupled to the host 110.

It should be understood that, among other effects achieved by aspects described in the present embodiment, those clear from the present specification description or those that could be thought of by the skilled person in the art as appropriate are achieved by the present disclosure.

What is claimed is:

1. A detection device comprising:
    a detector including a plurality of first electrodes arranged in a predetermined direction and a plurality of second electrodes disposed around a detection region in which the first electrodes are disposed;
    a detection circuit configured to detect proximity of an external object to the detector based on electrical change at the first electrodes;
    a power circuit configured to generate a square wave based on electric power supply from outside; and
    a filter that is coupled to the power circuit through an isolator and configured to receive the square wave transmitted through the isolator, wherein
    the filter includes a low-pass filter circuit and a digital potentiometer,
    a periodically oscillating potential based on output from the filter is provided as a reference potential of the power circuit and provided to the second electrodes,
    a reference potential of the filter is a fixed potential,
    the power circuit is provided capable of changing the frequency of the generated square wave, and
    the filter is provided capable of changing the frequency of the periodically oscillating potential in accordance with an electric resistance value of the digital potentiometer.

2. The detection device according to claim 1, wherein the filter includes an amplification circuit configured to amplify the periodically oscillating potential and provide the amplified periodically oscillating potential to the power circuit and the second electrodes.

3. The detection device according to claim 1, wherein the periodically oscillating potential is a sine wave generated based on the square wave by the filter.

4. The detection device according to claim 1, wherein the low-pass filter circuit cuts a frequency band in accordance with the electric resistance value of the digital potentiometer.

5. The detection device according to claim 1, wherein the digital potentiometer is provided as an electric resistor included in a Sallen-Key filter circuit provided as the low-pass filter circuit.

6. The detection device according to claim 1, further comprising a setting circuit configured to set the frequency of the square wave and the frequency of the periodically oscillating potential, wherein a reference potential of the setting circuit is the fixed potential.

* * * * *